(12) United States Patent
Chung

(10) Patent No.: US 7,952,406 B2
(45) Date of Patent: May 31, 2011

(54) DELAY LOCKED LOOP CIRCUIT

(75) Inventor: Jin-Il Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/616,413

(22) Filed: Nov. 11, 2009

(65) Prior Publication Data

US 2011/0001525 A1 Jan. 6, 2011

(30) Foreign Application Priority Data

Jul. 1, 2009 (KR) .................. 10-2009-0059712

(51) Int. Cl.
 *H03L 7/06* (2006.01)
(52) U.S. Cl. ............... 327/158; 327/149; 327/161
(58) Field of Classification Search .............. 327/149, 327/158, 161, 162
See application file for complete search history.

(56) References Cited

U.S. PATENT DOCUMENTS

| | | | |
|---|---|---|---|
| 6,552,587 B2 * | 4/2003 | Kim et al. ............. | 327/158 |
| 7,501,868 B2 * | 3/2009 | Ito .......................... | 327/158 |
| 7,626,432 B2 * | 12/2009 | Yamane ................. | 327/158 |
| 7,733,141 B2 * | 6/2010 | Oh .......................... | 327/158 |

* cited by examiner

*Primary Examiner* — Hai L Nguyen
(74) *Attorney, Agent, or Firm* — IP & T Group LLP

(57) ABSTRACT

A delay locked loop circuit includes: a voltage level detector for detecting of an external power source voltage level; a phase comparator for comparing phases of reference clock and feedback clock; a clock delayer for designating one of a first delay cell unit and a second delay cell unit as initial delay cell unit and the other as connected delay cell unit, delaying the reference clock by the initial delay cell unit until delay amount of the reference clock reaches a predetermined delay amount, delaying the reference clock by the connected delay cell unit after the delay amount of the reference clock reaches the predetermined delay amount in response to an output signal of the phase comparator, and outputting a delay locked clock; and a delay duplication modeler for changing the delay locked clock to reflect an actual delay condition of the reference clock and outputting the feedback clock.

22 Claims, 6 Drawing Sheets

DELAY LOCKED LOOP CIRCUIT

CROSS-REFERENCE TO RELATED APPLICATIONS

The present application claims priority of Korean Patent Application No. 10-2009-0059712, filed on Jul. 1, 2009, which is incorporated herein by reference in its entirety.

BACKGROUND OF THE INVENTION

Exemplary embodiments of the present invention relate to semiconductor designing technology, and more particularly, to a delay locked loop circuit.

A synchronous semiconductor memory device such as Double Data Rate Synchronous Dynamic Random Access Memory (DDR SDRAM) transfers/receives data to/from an external device by using an internal clock synchronized with an external clock inputted from the external device such as a memory controller. It is important to temporally synchronize a data outputted from a memory with an external clock supplied from a memory controller to the memory to stably transfer data between the memory and the memory controller.

The data is outputted from the memory in synchronization with an internal clock. When the internal clock is supplied to the memory at first, it is supplied in synchronization with an external clock. The internal clock, however, becomes delayed as it goes through the constituent elements of the memory and when it is outputted from the memory, it is not synchronized with an external clock.

Therefore, in order to stably transfer the data outputted from the memory, the internal clock should be compensated by an offset corresponding to the time taken when the data is loaded on a bus so that the internal clock delayed as it goes through the constituent elements of the memory which transfers the data is positioned exactly at an edge or the center of an external clock supplied by the memory controller and thus the internal clock is synchronized with the external clock.

Among the clock synchronization circuits performing this operation are a Phase Locked Loop (PLL) circuit and a Delay Locked Loop (DLL) circuit.

When the external clock frequency differs from the internal clock frequency, a phase locked loop circuit is usually used because a frequency multiplication function is needed. However, when external clock frequency is the same as internal clock frequency, a delay locked loop circuit is usually used because the delay locked loop circuit is less affected by noise than the phase locked loop circuit and the delay locked loop circuit can be realized in a relatively small area.

In short, since semiconductor memory devices use the same frequency, they usually employ a delay locked loop circuit as a clock synchronization circuit.

Among the kinds of the delay locked loop circuit, a register-controlled delay locked loop circuit is widely used in a semiconductor memory device. The register-controlled delay locked loop circuit is equipped with a register that can store a fixed delay value and when a power source is cut off, the register-controlled delay locked loop circuit stores the fixed delay value in the register and when the power source is turned on, it loads the fixed delay value out of the register and uses it to fix the internal clock. In this way, it is possible to perform a clock synchronization operation at a time point when the phase difference between an internal clock and an external clock is relatively small during the initial operation of the semiconductor memory device. Also, the register-controlled delay locked loop circuit can reduce the time taken for synchronizing an internal clock with an external clock by controlling the varying width of the delay value stored in the register according to the phase difference between the internal clock and the external clock even after the initial operation.

FIG. 1 is a block diagram illustrating a conventional register-controlled delay locked loop circuit. Referring to FIG. 1, the conventional register-controlled delay locked loop circuit includes a phase comparison unit 100, a clock delay unit 120, and a delay duplication modeling unit 140. The phase comparison unit 100 compares the phase of a reference clock with the phase of a feedback clock FBCLK and generates a delay locked control signal DELAY_LOCK_CTRL corresponding to the comparison result. The clock delay unit 120 delays the reference clock REFCLK in response to the delay locked control signal DELAY_LOCK_CTRL for delay locking and outputs a delay locked clock DLLCLK. The delay duplication modeling unit 140 changes the delay locked clock DLLCLK to reflect the delay time of an actual output path of the reference clock REFCLK and outputs a feedback clock FBCLK.

Hereafter, a basic locking operation of the conventional register-controlled delay locked loop circuit having the above-described structure will be described. The phase of a reference clock REFCLK is delayed and outputted as a delay locked clock DLLCLK so as to synchronize a reference edge of the reference clock REFCLK with a reference edge of a feedback clock FBCLK. Herein, the reference edge of the reference clock REFCLK generally indicates a rising edge but there is no problem even if a falling edge becomes the reference edge. Since the delay locked clock DLLCLK reflects the actual delay condition of the reference clock REFCLK path and outputted as a feedback clock FBCLK, the phase difference between the reference clock REFCLK and the feedback clock FBCLK gradually decreases as the phase delay amount of the reference clock REFCLK increases.

However, the conventional register-controlled delay locked loop circuit should delay the phase of the reference clock REFCLK step by step for delay locking when it performs the operation of delaying the phase of the reference clock REFCLK and outputs a delay locked clock DLLCLK. To this end, although not directly illustrated in FIG. 1, the conventional register-controlled delay locked loop circuit delays the phase of the reference clock REFCLK step by step by using a plurality of delay cells each having a predetermined delay amount.

Since each delay cell is formed of an active device such as a NAND gate or an inverter, each delay cell may have a problem of a delay amount varying according to a change in the level of an external power source voltage VDD.

SUMMARY OF THE INVENTION

An embodiment of the present invention is directed to providing a delay locked loop circuit that can stably perform a delay locked operation regardless of a variation in the level of external power source voltage.

In accordance with an aspect of the present invention, there is provided a delay locked loop circuit, which includes: a voltage level detection unit configured to detect a level of an external power source voltage; a phase comparison unit configured to compare a phase of a reference clock with a phase of a feedback clock; a clock delay unit configured to designate one of a first delay cell unit and a second delay cell unit having a longer delay than the first delay cell unit as an initial delay cell unit and the other as a connected delay cell unit based on an output signal of the voltage level detection unit, delay the reference clock by the initial delay cell unit until a delay amount of the reference clock reaches a predetermined delay amount, delay the reference clock by the connected delay cell unit after the delay amount of the reference clock reaches the predetermined delay amount in response to an output signal of the phase comparison unit, and output a delay locked clock; and a delay duplication modeling unit configured to change the delay locked clock to reflect an actual delay condition of the reference clock and output the feedback clock.

In accordance with another aspect of the present invention, there is provided a delay locked loop circuit, which includes: a voltage level detection unit configured to detect a level of an external power source voltage; a phase comparison unit configured to compare a phase of a reference clock with a phase of a feedback clock; a first clock delay unit configured to delay the reference clock by a first delay cell unit in response to an output signal of the phase comparison unit; a second clock delay unit configured to delay the reference clock by a second delay cell unit having a longer delay than the first delay cell unit in response to an output signal of the phase comparison unit; a delay selection control unit configured to perform a control to designate one of a first clock delay unit and a second clock delay unit as an initial delay unit and the other as a connected delay unit based on an output signal of the voltage level detection unit, and delay the reference clock by operating the initial delay unit until a delay amount of the reference clock reaches a predetermined delay amount and operating the connected delay unit after the delay amount of the reference clock reaches the predetermined delay amount; and a delay duplication modeling unit configured to change the delay locked clock outputted from the first and second clock delay units to reflect an actual delay condition of the reference clock and output the feedback clock.

DESCRIPTION OF SPECIFIC EMBODIMENTS

Figure 1:
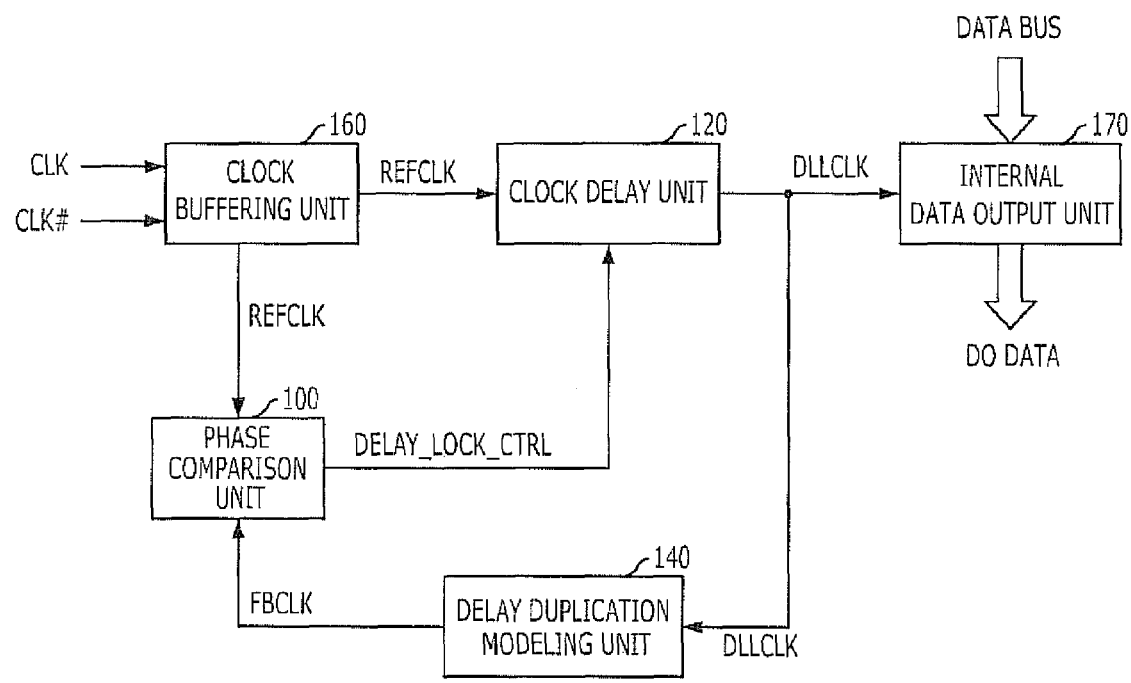
FIG. 1 is a block diagram illustrating a conventional register-controlled delay locked loop (DLL) circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

Figure 2:
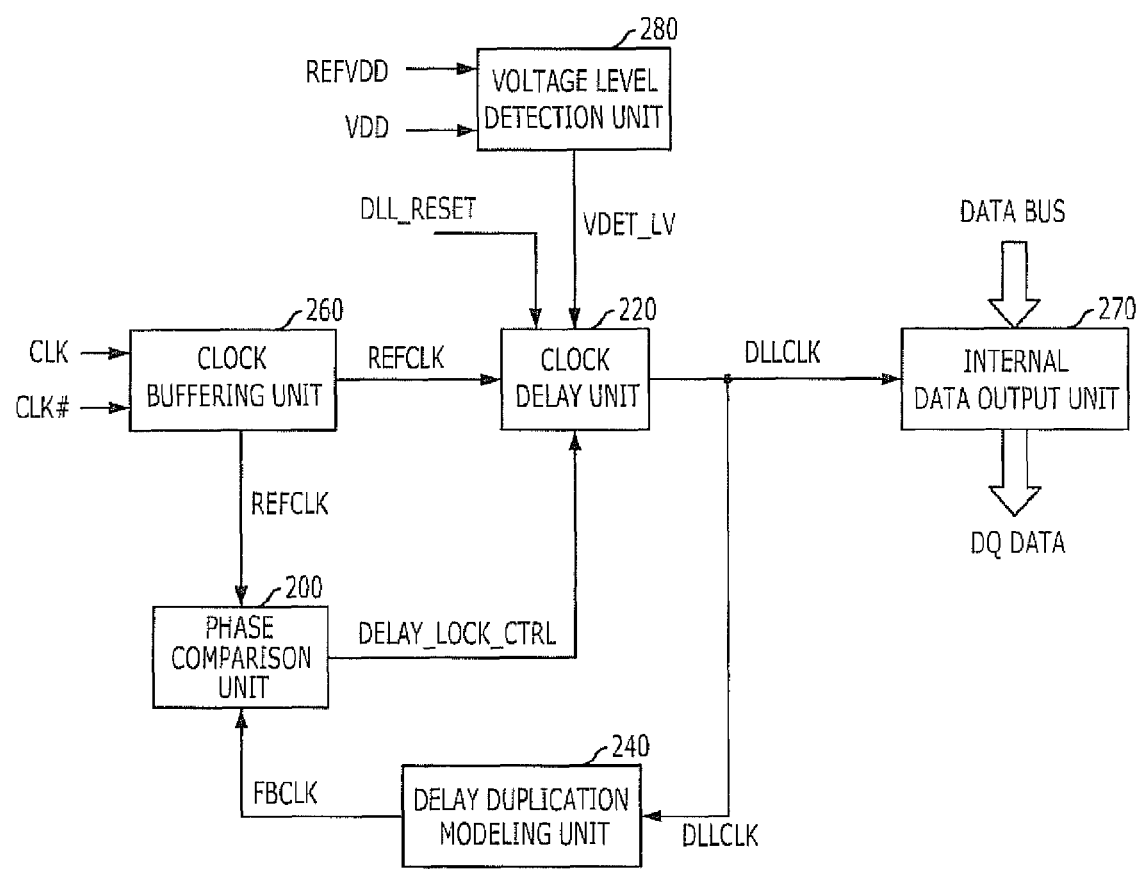
FIG. 2 is a block diagram illustrating a register-controlled delay locked loop circuit in accordance with a first embodiment of the present invention.

FIG. 2 is a block diagram illustrating a register-controlled delay locked loop circuit in accordance with a first embodiment of the present invention.

Figure 3:
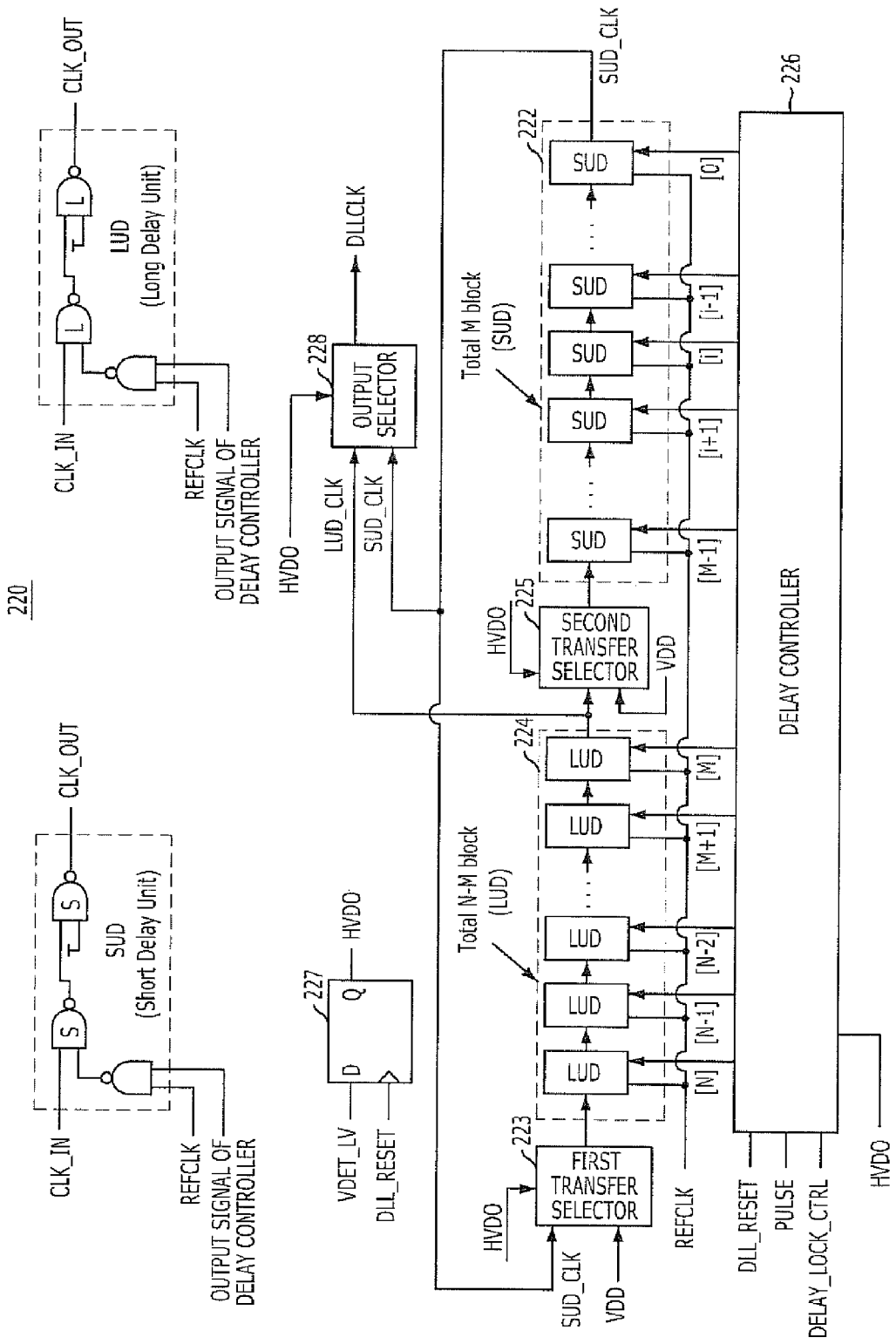
FIG. 3 is a block diagram depicting a clock delay unit of the register-controlled delay locked loop circuit shown in FIG. 2 in accordance with the first embodiment of the present invention.

FIG. 3 is a block diagram depicting a clock delay unit of the register-controlled delay locked loop circuit shown in FIG. 2 in accordance with the first embodiment of the present invention.

Referring to FIGS. 2 and 3, the register-controlled delay locked loop circuit includes a voltage level detection unit 280, a phase comparison unit 200, a clock delay unit 220, and a delay duplication modeling unit 240. The voltage level detection unit 280 detects the level of external power source voltage VDD. The phase comparison unit 200 compares the phase of a reference clock REFCLK with the phase of a feedback clock FBCLK.

The clock delay unit 220 designates any one of a delay time unit of a first delay cell SUD, which will be referred to as a first delay cell unit hereafter, and a delay time unit of a second delay cell LUD, which will be referred to as a second delay cell unit hereafter, as an initial delay cell unit and the other as a connected delay cell unit according to an output signal VDET_LV of the voltage level detection unit 280, delays the reference clock REFCLK in response to an output signal DELAY_LOCK_CTRL of the phase comparison unit 200, and outputs a delay locked clock DLLCLK. Herein, the second delay cell LUD has a greater delay time unit than the first delay cell SUD. Until the delay amount reaches a predetermined delay amount, the clock delay unit 220 delays the reference clock REFCLK by as much as a delay of the initial delay cell unit and after it reaches the predetermined delay amount, the clock delay unit 220 delays the reference clock REFCLK by as much as a is delay of the connected delay cell unit.

The delay duplication modeling unit 240 changes the delay locked clock DLLCLK to reflect an actual delay condition of the reference clock REFCLK and outputs the delay locked clock DLLCLK as a feedback clock FBCLK.

Also, the register-controlled delay locked loop circuit further includes a clock buffering unit 260 and an internal data output unit 270. The clock buffering unit 260 buffers external clocks CLK and CLK# supplied from the exterior and outputs a reference clock REFCLK. The internal data output unit 270 outputs an internal data loaded on a data bus to the exterior through a DQ pad in response to a delay locked clock DLLCLK.

Figure 4A:
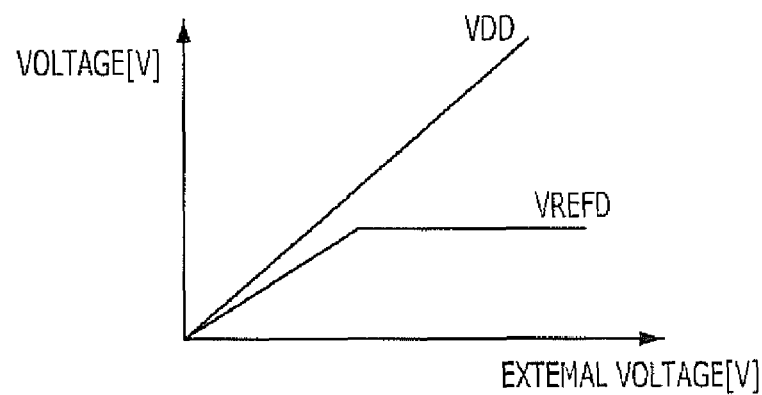
FIGS. 4A and 4B show a graph and a circuit diagram depicting a voltage level detection unit of the register-controlled delay locked loop circuit shown in FIG. 2 in accordance with the first embodiment of the present invention.
Figure 4B:
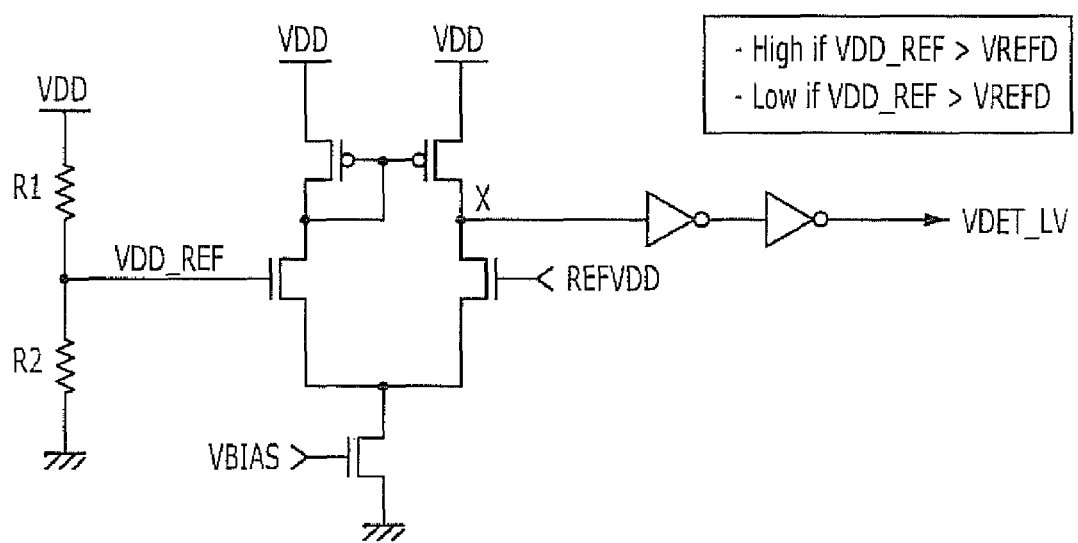

In a close look at the structure of the voltage level detection unit 280 with reference to FIGS. 4A and 4B, FIGS. 4A and 4B show a graph and a circuit diagram depicting a voltage level detection unit of the register-controlled delay locked loop circuit shown in FIG. 2 in accordance with the first embodiment of the present invention. The voltage level detection unit 280 is a differential comparator for comparing the levels of two voltages inputted differentially. When the level of an external power source voltage VDD is higher than a reference voltage REFVDD having a predetermined voltage level, the voltage level detection unit 280 outputs a detection signal VDET_LV, which is activated to a logic high level. When the level of the external power source voltage VDD is lower than the reference voltage REFVDD, it outputs a detection signal VDET_LV, which is inactivated to a logic low level.

The clock delay unit 220 designates a first delay cell unit as an initial delay cell unit and a second delay cell unit as a connected delay cell unit in response to the detection signal VDET_LV inactivated to a logic low level in a period where a delay locked reset signal DLL_RESET is activated to a logic high level and a delay locked operation is not performed. Also, the clock delay unit 220 designates the second delay cell unit as an initial delay cell unit and the first delay cell unit as a connected delay cell unit in response to the detection signal VDET_LV activated to a logic high level in a period where a delay locked reset signal DLL_RESET is activated to a logic high level and a delay locked operation is not performed.

Furthermore, in a period where the delay locked reset signal DLL_RESET is inactivated to a logic low level and the delay locked operation is performed, the clock delay unit 220 maintains the delay cell units designated as the initial delay cell unit and the connected delay cell unit in the previous period where the delay locked operation is not performed, regardless of the logic level of the detection signal VDET_LV.

For example, if the first delay cell unit is designated as the initial delay cell unit and the second delay cell unit is designated as the connected delay cell unit in the previous duration where the delay locked operation is not performed, the clock delay unit 220 maintains the state of the first delay cell unit designated as the initial delay cell unit and the second delay cell unit designated as the connected delay cell unit in the period where the delay locked reset signal DLL_RESET is inactivated to a logic low level and the delay locked operation is performed, regardless of the change in the logic level of the detection signal VDET_LV.

The phase comparison unit 200 outputs a delay locked control signal DELAY_LOCK_CTRL, which is inactivated to a logic low level when the phase difference between a reference clock REFCLK and a feedback is clock FBCLK goes beyond a predetermined range. When the phase difference between the reference clock REFCLK and the feedback clock FBCLK does not go beyond the predetermined range, the phase comparison unit 200 outputs a delay locked control signal DELAY_LOCK_CTRL, which is activated to a logic high level.

The operation of the clock delay unit 220 corresponding to the operation of the phase comparison unit 200 is as follows. In response to the delay locked control signal DELAY_LOCK_CTRL inactivated to a logic low level, the clock delay unit 220 delays the reference clock REFCLK. In response to the delay locked control signal DELAY_LOCK_CTRL activated to a logic high level, the clock delay unit 220 does not delay the reference clock REFCLK.

In a close look at the operation of the clock delay unit 220 corresponding to the operation of the phase comparison unit 200, in response to the delay locked control signal DELAY_LOCK_CTRL inactivated to a logic low level, the clock delay unit 220 delays the reference clock REFCLK by the initial delay cell unit, which may be the first delay cell unit or the second delay cell unit, for each predetermined cycle. When the delay locked control signal DELAY_LOCK_CTRL continues to be inactivated to a logic low level even after the reference clock REFCLK is delayed by as much as the predetermined delay amount, the clock delay unit 220 delays the reference clock REFCLK by the connected delay cell unit, which may be the first delay cell unit or the second delay cell unit, for each predetermined cycle. Herein, regardless of whether the reference clock REFCLK is being delayed by the initial delay cell unit or the connected delay cell unit, the clock delay unit 220 does not delay the reference clock REFCLK when the delay locked control is signal DELAY_LOCK_CTRL is activated to a logic high level.

The phase comparison unit 200 may operate in such a manner that the logic level of the delay locked control signal DELAY_LOCK_CTRL changes based on a predetermined one range as described above. However, it may also operate in such a manner that the logic levels of a plurality of delay locked control signals DELAY_LOCK_CTRL changes based on predetermined multiple ranges, which are established as follows.

Controlling the delay amount of the clock delay unit 220 based on the delay locked control signal DELAY_LOCK_CTRL makes it possible for the delay amount of the clock delay unit 220 to be increased/decreased according to the logic level of the delay locked control signal DELAY_LOCK_CTRL. However, when the delay amount of the clock delay unit 220 is controlled based on multiple delay locked control signals DELAY_LOCK_CTRL, in addition to the operation of decreasing and increasing a delay amount of the clock delay unit 220 is performed, an operation of differentiating the varying range of the delay amount of the clock delay unit 220 based on the logic level of the delay locked control signal DELAY_LOCK_CTRL may be performed.

For the sake of convenience in description, it is assumed that there are a predetermined first range and a predetermined second range as for the multiple predetermined ranges and a normal delay locked control signal and an abnormal delay locked control signal as for the multiple delay locked control signals DELAY_LOCK_CTRL. Since the operation with the predetermined multiple ranges and the multiple delay locked control signals is similar to the operation shown in FIG. 2 although the operational complexity may be higher, they will be described by referring to the reference numerals and structure shown in FIG. 2.

When the phase difference between the reference clock REFCLK and the feedback clock FBCLK goes beyond the predetermined first range, the phase comparison unit 200 outputs a normal delay locked control signal DELAY_LOCK_CTRL_NORMAL inactivated to a logic low level. When the phase difference between the reference clock REFCLK and the feedback clock FBCLK does not go beyond the predetermined first range, the phase comparison unit 200 outputs a normal delay locked control signal DELAY_LOCK_CTRL_NORMAL activated to a logic high level. When the phase difference between the reference clock REFCLK and the feedback clock FBCLK goes beyond the predetermined second range, for example, which is narrower than the first range, the phase comparison unit 200 outputs a fine delay locked control signal DELAY_LOCK_CTRL_FINE inactivated to a logic low level. When the phase difference between the reference clock REFCLK and the feedback clock FBCLK does not go beyond the predetermined second range, the phase comparison unit 200 outputs a fine delay locked control signal DELAY_LOCK_CTRL_FINE activated to a logic high level.

The operation of the clock delay unit 220 corresponding to the operation of the phase comparison unit 200 is as follows. In response to the normal delay locked control signal DELAY_LOCK_CTRL_NORMAL inactivated to a logic low level, the clock delay unit 220 delays the reference clock REFCLK by the initial delay cell unit or the connected delay cell unit for each predetermined cycle. In response to the fine delay locked control signal DELAY_LOCK_CTRL_FINE inactivated to a logic low level and the normal delay locked control signal DELAY_LOCK_CTRL_NORMAL activated to a logic high level, the clock delay unit 220 delays the reference clock REFCLK by as much as a delay amount obtained by dividing the delay amount corresponding to the initial delay cell unit or the connected delay cell unit by a predetermined number for each predetermined cycle. In response to the fine delay locked control signal DELAY_LOCK_CTRL_FINE activated to a logic high level, the clock delay unit 220 does not delay the reference clock REFCLK any more.

In a close look at the operation of the clock delay unit 220 corresponding to the operation of the phase comparison unit 200, in response to the normal delay locked control signal DELAY_LOCK_CTRL_NORMAL inactivated to a logic low level, the clock delay unit 220 delays the reference clock REFCLK by the initial delay cell unit, which may be the first delay cell unit or the second delay cell unit, for each predetermined cycle. In response to the normal delay locked control signal DELAY_LOCK_CTRL_NORMAL activated to a logic high level and the fine delay locked control signal DELAY_LOCK_CTRL_FINE inactivated to a logic low level before the reference clock REFCLK is delayed by as much as a predetermined delay amount, the clock delay unit 220 delays the reference clock REFCLK by a delay amount obtained by dividing the delay amount of the initial delay cell unit into a predetermined number of divided delay amount of the initial delay cell unit for each predetermined cycle. In response to the fine delay locked control signal DELAY_LOCK_CTRL_FINE activated to a logic high level, the clock delay unit 220 does not delay the reference clock REFCLK.

Likewise, in response to the normal delay locked control signal DELAY_LOCK_CTRL_NORMAL inactivated to a logic low level, the clock delay unit 220 delays the reference clock REFCLK by the initial delay cell unit, which may be the first delay cell unit or the second delay cell unit, for each predetermined cycle. In response to the normal delay locked control signal DELAY_LOCK_CTRL_NORMAL inactivated to a logic low level after the reference clock REFCLK is delayed by a predetermined delay amount, the clock delay unit 220 delays the reference clock REFCLK by the connected delay cell unit, which is not selected as the initial delay cell unit among the first delay cell unit and the second delay cell unit, for each predetermined cycle. In response to the normal delay locked control signal DELAY_LOCK_CTRL_NORMAL activated to a logic high level and the fine delay locked control signal DELAY_LOCK_CTRL_FINE inactivated to a logic low level after the reference clock REFCLK is delayed by as much as a predetermined delay amount, the clock delay unit 220 delays the reference clock REFCLK by a delay amount obtained by dividing the delay amount of the connected delay cell unit into a predetermined number of divided delay amount of the connected delay cell unit for each predetermined cycle. In response to the fine delay locked control signal DELAY_LOCK_CTRL_FINE activated to a logic high level after the reference clock REFCLK is delayed by as much as the predetermined delay amount, the clock delay unit 220 does not delay the reference clock REFCLK.

Referring to FIG. 3, the structure of the clock delay unit 220 will be described in detail. The clock delay unit 220 includes a delay line selection signal generator 227, a delay controller 226, a first delay line 222, a second delay line 224, an output selector 228, a first transfer selector 223, and a second transfer selector 225. The delay line selection signal generator 227 generates a delay line selection signal HVDO in response to a detection signal VDET_LV in an operation period corresponding to a delay locked reset signal DLL_RESET. The delay controller 226 varies the logic levels of signals [0], . . . , [i−1], [i], [i+1], . . . , [M−1], [M], [M+1], . . . , [N−2], [N−1], [N] for determining a delay amount of a delay line selected in correspondence to the delay line selection signal HVDO based on the output signal DELAY_LOCK_CTRL of the phase comparison unit 200 at each cycle corresponding to a pulse signal in an operation period corresponding to the delay locked reset signal DLL_RESET. The first delay line 222 includes a plurality of first delay cells SUD connected in series and delays a reference clock REFCLK or an output clock LUD_CLK of the second delay line 224 by a delay amount corresponding to M output signals [0], . . . , [i−1], [i], [i+1], . . . , [M−1] of the delay controller 226 and outputs the delayed clock. The second delay line 224 includes a plurality of second delay cells LUD connected in series and delays a reference clock REFCLK or an output clock SUD_CLK of the first delay line 222 by a delay amount corresponding to N−M signals [M], [M+1], . . . , [N−2], [N−1], [N] of the delay controller 226 outputted from the delay controller 226 and outputs the delayed clock. The output selector 228 selects one of a clock SUD_CLK outputted from the first delay line 222 and a clock LUD_CLK outputted from the second delay line 224 in response to the delay line selection signal HVDO and outputs the selected clock as a delay locked clock DLLCLK. The second transfer selector 225 performs a control to transfer the output clock LUD_CLK of the second delay line 224 to the first delay line 222 in response to the delay line selection signal HVDO. The first transfer selector 223 performs a control to transfer the output clock SUD_CLK of the first delay line 222 to the second delay line 224 in response to the delay line selection signal.

Among the constituent elements of the clock delay unit 220, the delay line selection signal generator 227 performs an operation for determining the level of the delay line selection signal HVDO based on the level of the detection signal VDET_LV in a period where no delay locked operation is performed in response to a delay locked reset signal DLL_RESET.

For example, in a period where the delay locked reset signal DLL_RESET is activated to a logic high level and the delay locked operation is not performed, it generates a delay line selection signal HVDO having a logic high level in response to the logic high level of the detection signal VDET_LV or it generates a delay line selection signal HVDO having a logic low level in response to the logic low level of the detection signal VDET_LV.

Conversely, among the constituent elements of the clock delay unit 220, the delay line selection signal generator 227 does not change the level of the delay line selection signal HVDO regardless of the level of the detection signal VDET_LV in a period where a delay locked operation is performed in response to the delay locked reset signal DLL_RESET.

For example, in a period where the delay locked reset signal DLL_RESET is inactivated to a logic low level and the delay locked operation is performed, it does not matter whether the detection signal VDET_LV has a logic high level or a logic low level and the delay line selection signal generator 227 maintains the logic level of the delay line selection signal HVDO determined in the previous duration where the delay locked operation is not performed.

Among the constituent elements of the clock delay unit 220, the delay controller 226 does not change the logic levels of a pulse signal, the delay line selection signal HVDO, and signals [0], . . . , [i−1], [i], [i+1], . . . , [M−1], [M], [M+1], . . . , [N−2], [N−1], [N] outputted regardless of the level of the output signal DELAY_LOCK_CTRL of the phase comparison unit 200 in a period where the delay locked operation is not performed in response to the delay locked reset signal DLL_RESET. In short, among the constituent elements of the clock delay unit 220, the delay amounts of the first delay line 222 and the second delay line 224 are not changed but maintained.

Conversely, among the constituent elements of the clock delay unit 220, the delay controller 226 changes the logic levels of M signals [0], . . . , [i−1], [i], [i+1], . . . , [M−1] for determining a delay amount of the first delay line 222 and N-M signals [M], [M+1] . . . , [N−2], [N−1], [N] for determining a delay amount of the second delay line 224 according to the output signal DELAY_LOCK_CTRL of the phase comparison unit 200 in a sequence corresponding to the delay line selection signal HVDO at each cycle where a pulse signal is toggled in a period where the delay locked operation is performed in response to the delay locked reset signal DLL_RESET.

For example, when the delay line selection signal HVDO is a logic high level, the delay controller 226 changes the logic levels of N-M signals [M], [M+1] . . . , [N−2], [N−1], [N] for determining a delay amount of the second delay line 224 following M signals [0], [i−1], [i], [i+1], [M−1] for determining a delay amount of the first delay line 222 according to the output signal DELAY_LOCK_CTRL of the phase comparison unit 200 at each cycle where a pulse signal is toggled in a period where the delay locked reset signal DLL_RESET is inactivated to a logic low level and the delay locked operation is performed in response to the delay locked reset signal DLL_RESET. Also, when the delay line selection signal HVDO is a logic low level, the delay controller 226 changes the logic levels of the M signals [0], . . . , [i−1], [i], [i+1], . . . , [M−1] for determining a delay amount of the first delay line 222 following the N-M signals [M], [M+1] . . . , [N−2], [N−1], [N] for determining a delay amount of the second delay line 224 according to the output signal DELAY_LOCK_CTRL of the phase comparison unit 200 at each cycle where a pulse signal is toggled in a period where the delay locked reset signal DLL_RESET is inactivated to a logic low level and the delay locked operation is performed in response to the delay locked reset signal DLL_RESET.

Herein, when the output signal DELAY_LOCK_CTRL of the phase comparison unit 200 is a logic high level, the delay controller 226 changes the logic levels of the signals [0], . . . , [i−1], [i], [i+1], . . . , [M−1], [M], [M+1], . . . , [N−2], [N−1], [N] outputted in a form for increasing the delay amount of a selected delay line. When the output signal DELAY_LOCK_CTRL of the phase comparison unit 200 is a logic low level, the delay controller 226 changes the logic levels of the signals [0], . . . , [i−1], [i], [i+1], [M−1], [M], [M+1], [N−2], [N−1], [N] outputted in a form for decreasing the delay amount of a selected delay line.

Among the constituent elements of the clock delay unit 220, the output selector 228 selects one of a clock SUD_CLK outputted from the first delay line 222 and a clock LUD_CLK outputted from the second delay line 224 in response to the delay line selection signal HVDO and outputs the selected clock as a delay locked clock DLLCLK.

For example, the output selector 228 selects the clock SUD_CLK outputted from the first delay line 222 and outputs the clock SUD_CLK as a delay locked clock DLLCLK in response to the delay line selection signal HVDO activated to a logic high level, and selects the clock LUD_CLK outputted from the second delay line 224 and outputs the clock LUD_CLK as a delay locked clock DLLCLK in response to the delay line selection signal HVDO inactivated to a logic low level.

Among the constituent elements of the clock delay unit 220, the first transfer selector 223 transfers one of the output clock LUD_CLK of the second delay line 224 and a signal having a power source voltage VDD level to the first delay line 222 in response to the delay line selection signal HVDO. Herein, when the output clock LUD_CLK of the second delay line 224 is transferred to the first delay line 222, the first delay line 222 takes over the delay amount used for delaying the reference clock REFCLK in the second delay line 224 and performs an additional delay operation. On the other hand, when the signal having the power source voltage VDD level is transferred to the first delay line 222, the first delay line 222 independently performs an operation of delaying the reference clock REFCLK without taking over any delay amount.

Among the constituent elements of the clock delay unit 220, the second transfer selector 225 transfers one of the output clock SUD_CLK of the first delay line 222 and the signal having the power source voltage VDD level to the second delay line 224 in response to the delay line selection signal HVDO. Herein, when the output clock SUD_CLK of the first delay line 222 is transferred to the second delay line 224, the second delay line 224 takes over the delay amount used for delaying the reference clock REFCLK in the first delay line 222 and performs an additional delay operation. On the other hand, when the signal having the power source voltage VDD level is transferred to the second delay line 224, the second delay line 224 independently performs an operation of delaying the reference clock REFCLK without taking over any delay amount.

Herein, the first transfer selector 223 and the second transfer selector 225 each perform an operation in opposite to each other in response to the delay line selection signal HVDO. For example, in response to the delay line selection signal HVDO activated to a logic high level in the first transfer selector 223, the output clock LUD_CLK of the second delay line 224 is transferred to the first delay line 222. When the signal having the power source voltage VDD level is transferred to the first delay line 222 in response to the delay line selection signal HVDO inactivated to a logic low level, the second transfer selector 225 performs the opposite operation in which the second transfer selector 225 transfers the signal having the power source voltage VDD level to the second delay line 224 in response to the delay line selection signal HVDO activated to a logic high level and transfers the output clock SUD_CLK of the first delay line 222 to the second delay line 224 in response to the delay line selection signal HVDO inactivated to a logic low level.

Among the constituent elements of the clock delay unit 220, the first delay line 222 includes a plurality of first delay cells SUD connected in series inside and thus the first delay line 222 can delay an input clock by a delay amount of the first delay cell unit corresponding to the M output signals [0], . . . , [i−1], [i], [i+1], [M−1] outputted from the delay controller 226.

Herein, the clock inputted to the first delay line 222 may be the reference clock REFCLK or the output clock LUD_CLK of the second delay line 224. When the signal having the power source voltage VDD level is supplied from the first transfer selector 223, the input clock becomes the reference clock REFCLK.

In other words, when the first delay line 222 is selected as an initial delay cell, the input clock becomes the reference clock REFCLK. However, when the first delay line 222 is selected as a connected delay cell, the input clock becomes the output clock LUD_CLK of the second delay line 224.

Among the constituent elements of the clock delay unit 220, the second delay line 224 includes a plurality of second delay cells LUD connected in series inside and thus the second delay line 224 can delay an input clock by a delay amount of the second delay cell unit corresponding to the N-M signals [M], [M+1] ..., [N−2], [N−1], [N] outputted from the delay controller 226.

Herein, the clock inputted to the second delay line 224 may be the reference clock REFCLK or the output clock SUD_CLK of the first delay line 222. When the signal having the power source voltage VDD level is supplied from the second transfer selector 225, the input clock becomes the reference clock REFCLK.

In other words, when the second delay line 224 is selected as an initial delay cell, the input clock becomes the reference clock REFCLK. However, when the second delay line 224 is selected as a connected delay cell, the input clock becomes the output clock SUD_CLK of the first delay line 222.

As illustrated in FIG. 3, the detailed circuits of the first delay cell SUD and the second delay cell LUD are the same. The only difference is that the size of a logic device mounted inside the first delay cell SUD and the second delay cell LUD is different. To be specific, since the logic device mounted inside the first delay cell SUD is relatively small, the input clock, which may be the reference clock REFCLK or the output clock LUD_CLK, is delayed by a relatively small delay and then outputted. On the other hand, since the logic device mounted inside the second delay cell LUD is relatively large, the input clock, which may be the reference clock REFCLK or the output clock SUD_CLK, is delayed by a relatively larger delay and then outputted.

Figure 5:
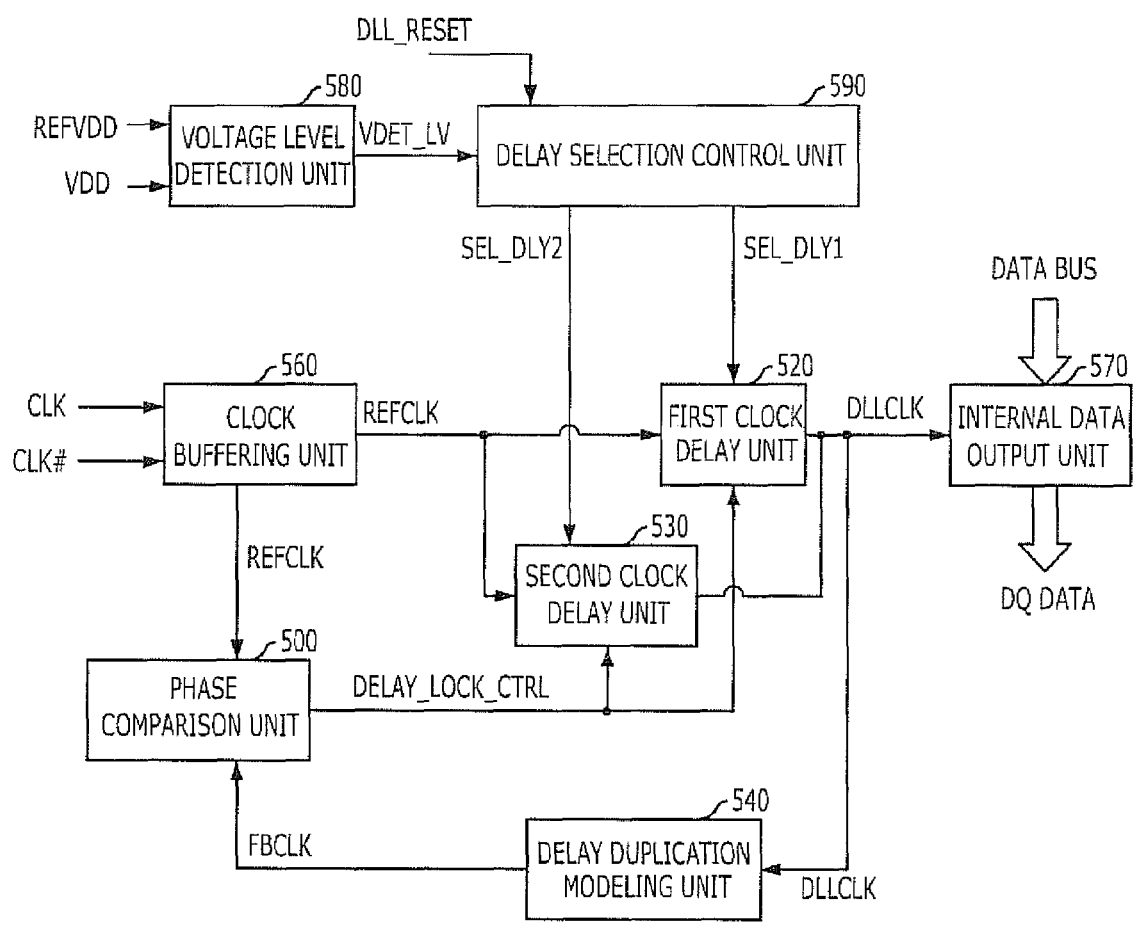
FIG. 5 is a block diagram illustrating a register-controlled delay locked loop circuit in accordance with a second embodiment of the present invention.

FIG. 5 is a block diagram illustrating a register-controlled delay locked loop circuit in accordance with a second embodiment of the present invention.

Figure 6:
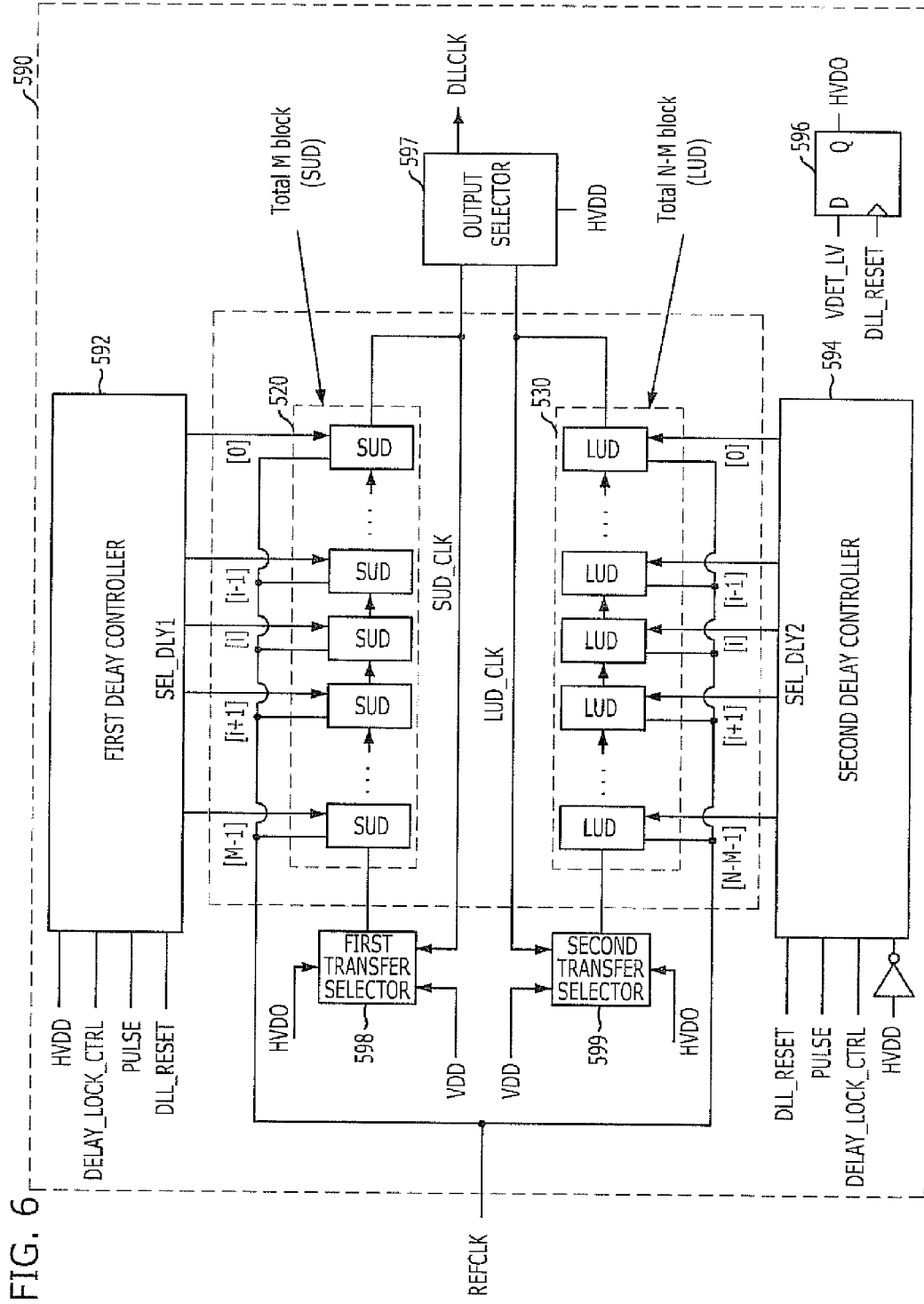
FIG. 6 is a block diagram depicting a clock delay unit in the register-controlled delay locked loop circuit shown in FIG. 5 in accordance with the second embodiment of the present invention.

FIG. 6 is a block diagram depicting a clock delay unit in the register-controlled delay locked loop circuit shown in FIG. 5 in accordance with the second embodiment of the present invention.

Referring to FIGS. 5 and 6, the register-controlled delay locked loop circuit includes a voltage level detection unit 580, a phase comparison unit 500, a first clock delay unit 520, a second clock delay unit 530, a delay selection control unit 590, and a delay duplication modeling unit 540. The voltage level detection unit 580 detects the level of an external power source voltage VDD. The phase comparison unit 500 compares the phase of a feedback clock FBCLK with the phase of a reference clock REFCLK. The first clock delay unit 520 delays the reference clock REFCLK by a first delay cell unit in response to an output signal DELAY_LOCK_CTRL of the phase comparison unit 500. The second clock delay unit 530 delays the reference clock REFCLK by a second delay cell unit in response to an output signal DELAY_LOCK_CTRL of the phase comparison unit 500. Herein, the second delay cell has a larger delay amount than the first delay cell. The delay selection control unit 590 designates one of the first clock delay unit 520 and the second clock delay unit 530 as an initial delay unit and the other as a connected delay unit based on an output signal VDET_LV of the voltage level detection unit 580, and performs a control to delay the reference clock REFCLK by operating the initial delay unit until a delay amount of the reference clock REFCLK reaches a predetermined delay amount and operating the connected delay unit after the delay amount of the reference clock REFCLK reaches a predetermined delay amount. The delay duplication modeling unit 540 changes a delay locked clock DLLCLK outputted either from the first clock delay unit 520 or the second clock delay unit 530 to reflect an actual delay condition of the reference clock REFCLK and outputs the reflected clock as a feedback clock FBCLK.

The register-controlled delay locked loop circuit further includes a clock buffering unit 560 and an internal data output unit 570. The clock buffering unit 560 buffers clocks CLK and CLK# supplied from the exterior and outputs a reference clock REFCLK. The internal data output unit 570 outputs DQ data based on internal data loaded on a data bus to the exterior through a DQ pad in response to a delay locked clock DLLCLK.

Herein, the voltage level detection unit 580 has the same structure and operation as the voltage level detection unit 280 mounted on the register-controlled delay locked loop circuit fabricated in accordance with the first embodiment of the present invention shown in FIGS. 4A and 4B. The voltage level detection unit 580 of the register-controlled delay locked loop circuit according to the second embodiment of the present invention has a form of a differential comparator which compares two different voltage levels inputted thereto.

Therefore, the voltage level detection unit 580 outputs a detection signal VDET_LV activated to a logic high level when the level of an external power source voltage VDD is higher than a reference voltage REFVDD having a predetermined voltage level, and outputs a detection signal VDET_LV inactivated to a logic low level when the level of an external power source voltage VDD is lower than a reference voltage REFVDD having a predetermined voltage level.

In a period where a delay locked reset signal DLL_RESET is activated to a logic high level and a delay locked operation is not performed, the delay selection control unit 590 designates the first clock delay unit 520 as an initial delay unit and the second clock delay unit 530 as a connection delay unit in response to a detection signal VDET_LV inactivated to a logic low level, and the delay selection control unit 590 designates the second clock delay unit 530 as an initial delay unit and the first clock delay unit 520 as a connected delay unit in response to a detection signal VDET_LV activated to a logic high level.

Also, the delay selection control unit 590 does not change the clock delay units designated as an initial delay unit and a connected delay unit, which are the first clock delay unit 520 and the second clock delay unit 530, respectively, in the previous duration where the delay locked operation is inactivated in a period where the delay locked reset signal DLL_RESET is inactivated to a logic low level and the delay locked operation is performed, regardless of the logic level of the detection signal VDET_LV.

For example, when the first clock delay unit 520 is designated as the initial delay unit and the second clock delay unit 530 is designated as the connected delay unit in the previous duration where the delay locked operation is not performed, the delay locked reset signal DLL_RESET is inactivated to a logic low level and the delay locked operation is performed in the current duration and the delay selection control unit 590 maintains the state that the first clock delay unit 520 is designated as the initial delay unit and the second clock delay unit 530 as the connection delay unit, regardless of a change in the logic level of the detection signal VDET_LV.

When the phase difference between the reference clock REFCLK and the feedback clock FBCLK goes beyond a predetermined range, the phase comparison unit 500 outputs a delay locked control signal DELAY_LOCK_CTRL inactivated to a logic low level. When the phase difference between the reference clock REFCLK and the feedback clock FBCLK does not go beyond a predetermined range, the phase comparison unit 500 outputs a delay locked control signal DELAY_LOCK_CTRL activated to a logic high level.

The operations of the first clock delay unit 520 and the second clock delay unit 530 corresponding to the above-described operation of the phase comparison unit 500 are delaying the reference clock REFCLK in response to the delay locked control signal DELAY_LOCK_CTRL inactivated to a logic low level and delaying the reference clock REFCLK in response to the delay locked control signal DELAY_LOCK_CTRL activated to a logic high level, respectively.

Hereafter, the operation of the delay selection control unit 590 will be described in detail. In response to the delay locked control signal DELAY_LOCK_CTRL inactivated to a logic low level, the delay selection control unit 590 performs a control to delay the reference clock REFCLK by a delay cell unit (which is the first delay cell unit when the first clock delay unit 520 is selected, or the second delay cell unit when the second clock delay unit 530 is selected) corresponding to the initial delay unit at each predetermined cycle by operating the initial delay unit, which may be the first clock delay unit 520 or the second clock delay unit 530. In response to the delay locked control signal DELAY_LOCK_CTRL continuously inactivated to a logic low level even after the reference clock REFCLK is delayed by as much as a predetermined delay amount, the delay selection control unit 590 performs a control to delay the reference clock REFCLK by a delay cell unit corresponding to the connected delay unit at each predetermined cycle by terminating the operation of the initial delay unit and operating the connected delay unit (which is a clock delay unit not designated as the initial delay unit in between the first clock delay unit 520 and the second clock delay unit 530). Herein, regardless of whether the reference clock REFCLK is being delayed by the operation of the initial delay unit or by the operation of the connected delay unit, the delay selection control unit 590 terminates the operation of the initial delay unit or the connected delay unit and performs a control not to delay the reference clock REFCLK in response to the delay locked control signal DELAY_LOCK_CTRL activated to a logic high level.

The phase comparison unit 500 may operate in such a manner that the logic level of the delay locked control signal DELAY_LOCK_CTRL is changed based on one predetermined range established through the above-described operation, or it may operate in such a manner that the logic levels of multiple delay locked control signals change based on predetermined multiple ranges as described below.

When the delay amount of the clock delay unit 520 is controlled by using one delay locked control signal DELAY_LOCK_CTRL, only an operation of increasing/decreasing the delay amount of the first clock delay unit 520 may be performed based on the logic level of the delay locked control signal. However, when the delay amount of the clock delay unit 520 is controlled by using multiple delay locked control signals, in addition to the operation of increasing/decreasing the delay amount of the first clock delay unit 520, an operation of changing a variation range of delay amount of the clock delay unit 520 based on the logic level of each of the delay locked control signals may be performed.

Also, for the sake of convenience in description, it is assumed that there are two ranges, a first predetermined range and a second predetermined range, as for the predetermined multiple ranges, and there are a normal delay locked control signal and a fine delay locked control signal as for the multiple delay locked control signals. Since the drawing of an operation using multiple predetermined ranges and multiple delay locked control signals may seem complex but its operation is substantially the same as the operation shown in FIG. 5, the operation will be described with reference to the reference numerals and structure shown of FIG. 5.

When the phase difference between the reference clock REFCLK and the feedback clock FBCLK goes beyond a first predetermined range, the phase comparison unit 500 outputs a normal delay locked control signal DELAY_LOCK_CTRL_NORMAL inactivated to a logic low level. When the phase difference between the reference clock REFCLK and the feedback clock FBCLK does not go beyond the first predetermined range, the phase comparison unit 500 outputs a normal delay locked control signal DELAY_LOCK_CTRL_NORMAL activated to a logic high level. When the phase difference between the reference clock REFCLK and the feedback clock FBCLK goes beyond a second predetermined range, which is narrower than the first predetermined range, the phase comparison unit 500 outputs a fine delay locked control signal DELAY_LOCK_CTRL_FINE inactivated to a logic low level. When the phase difference between the reference clock REFCLK and the feedback clock FBCLK does not go beyond the second predetermined range, the phase comparison unit 500 outputs a fine delay locked control signal DELAY_LOCK_CTRL_FINE activated to a logic high level.

The operation of the delay selection control unit 590 corresponding to the phase comparison unit 500 includes: performing a control to delay the reference clock REFCLK with a delay cell unit corresponding to the initial delay unit or the connected delay unit at each predetermined cycle by operating the initial delay unit or the connected delay unit in response to the normal delay locked control signal DELAY_LOCK_CTRL_NORMAL inactivated to a logic low level, performing a control to delay the reference clock REFCLK by a delay amount obtained by dividing the delay amount of a delay cell corresponding to the initial delay unit or the connected delay unit by a predetermined number at each predetermined cycle by operating the initial delay unit or the connected delay unit in response to the fine delay locked control signal DELAY_LOCK_CTRL_FINE inactivated to a logic low level and the normal delay locked control signal DELAY_LOCK_CTRL_NORMAL activated to a logic high level, and performing a control not to delay the reference clock REFCLK any more by terminating the initial delay unit or the connected delay unit in response to the fine delay locked control signal DELAY_LOCK_CTRL_FINE activated to a logic high level.

In a close look at the operation of the delay selection control unit 590 corresponding to the operation of the phase comparison unit 500, the delay selection control unit 590 performs a control to delay the reference clock REFCLK by a delay cell unit (which is a first delay cell unit when the first clock delay unit 520 is selected or a second delay cell unit when the second clock delay unit 530 is selected) corresponding to the initial delay unit at each predetermined cycle by operating the initial delay unit (which may be the first clock delay unit 520 or the second clock delay unit 530) in response to the normal delay locked control signal DELAY_LOCK_CTRL_NORMAL inactivated to a logic low level. The delay selection control unit 590 performs a control to delay the reference clock REFCLK by a delay amount obtained by dividing the delay amount of a delay cell corresponding to the initial delay unit by a predetermined number at each predetermined cycle by operating the initial delay unit in response to the normal delay locked control signal DELAY_LOCK_CTRL_NORMAL activated to a logic high level and the fine delay locked control signal DELAY_LOCK_CTRL_FINE inactivated to a logic low level before the reference clock REFCLK is delayed by a predetermined delay amount. The delay selection control unit 590 performs a control to stop delaying the reference clock REFCLK by terminating the operation of the initial delay unit in response to the fine delay locked control signal DELAY_LOCK_CTRL_FINE activated to a logic high level before the reference clock REF-CLK is delayed by a predetermined delay amount.

Similarly, the delay selection control unit 590 performs a control to delay the reference clock REFCLK by a delay cell unit (which is the first delay cell unit when the first clock delay unit 520 is selected or the second delay cell unit when the second clock delay unit 530 is selected) corresponding to the initial delay unit at each cycle by operating the initial delay unit (which may be the first clock delay unit 520 or the second clock delay unit 530) in response to the normal delay locked control signal DELAY_LOCK_CTRL_NORMAL inactivated to a logic low level. The delay selection control unit 590 performs a control to delay the reference clock REFCLK by a delay cell unit of a delay cell corresponding to the connected delay unit at each cycle by terminating the operation of the initial delay unit and operating the connected delay unit (which is a clock delay unit not designated to the initial delay unit between the first clock delay unit 520 and the second clock delay unit 530) in response to the normal delay locked control signal DELAY_LOCK_CTRL_NORMAL inactivated to a logic low level after the reference clock REF-CLK is delayed by a predetermined delay amount. The delay selection control unit 590 performs a control to delay the reference clock REFCLK by a delay amount obtained by dividing the delay amount of a delay cell corresponding to the connected delay unit by a predetermined number at each predetermined cycle by operating the connected delay unit in response to the normal delay locked control signal DELAY_LOCK_CTRL_NORMAL activated to a logic high level and the fine delay locked control signal DELAY_LOCK_CTRL_FINE inactivated to a logic low level after the reference clock REFCLK is delayed by a predetermined delay amount. The delay selection control unit 590 also performs a control not to delay the reference clock REFCLK any more by terminating the operation of the connected delay unit in response to the fine delay locked control signal DELAY_LOCK_CTRL_FINE activated to a logic high level after the reference clock REFCLK is delayed by the predetermined delay amount.

Referring to FIG. 6, the structure of the delay selection control unit 590 will be described in detail hereafter. The delay selection control unit 590 includes a delay line selection signal generator 596, a first delay controller 592, a second delay controller 594, an output selector 597, a first transfer selector 598, and a second transfer selector 599. The delay line selection signal generator 596 generates a delay unit selection signal HVDO in response to a detection signal VDET_LV in an operation period corresponding to a delay locked reset signal DLL_RESET.

The delay controller 592 varies the logic levels of signals SEL_DLY1[0], . . . , SEL_DLY1[i−1], SEL_DLY1[i], SEL_DLY1[i+1], . . . , SEL_DLY1[M−1] for controlling a delay operation of the first clock delay unit 520 based on the delay unit selection signal HVDO at each cycle corresponding to a pulse signal in an operation period corresponding to the delay locked reset signal DLL_RESET according to an output signal DELAY_LOCK_CTRL of the phase comparison unit 500. The second delay controller 594 varies the logic levels of signals SEL_DLY2[0], . . . , SEL_DLY2[i−1], SEL_DLY2[i], SEL_DLY2[i+1], SEL_DLY2[N−M−1] for controlling a delay operation of the second clock delay unit 530 based on the delay unit selection signal HVDO at each cycle corresponding to a pulse signal in an operation period corresponding to the delay locked reset signal DLL_RESET according to an output signal DELAY_LOCK_CTRL of the phase comparison unit 500.

The output selector 597 selects one of a clock SUD_CLK outputted from the first clock delay unit 520 and a clock LUD_CLK outputted from the second clock delay unit 530 and outputs a delay locked clock DLLCLK in the delay unit selection signal HVDO.

The first transfer selector 598 performs a control to transfer the output clock LUD_CLK of the second clock delay unit 530 to the first clock delay unit 520 in response to the delay unit selection signal HVDO. The second transfer selector 599 performs a control to transfer the output clock SUD_CLK of the first clock delay unit 520 to the second clock delay unit 530

In a close look at the structures of the first clock delay unit 520 and the second clock delay unit 530 by referring to FIG. 6, the first clock delay unit 520 includes a plurality of first delay cells connected to each other in series. Among the constituent elements of the delay selection control unit 590, the first clock delay unit 520 controls the delay operations of the respective first delay cells in response to M signals SEL_DLY1[0], SEL_DLY1[i−1], SEL_DLY1[i], SEL_DLY1[i+1], . . . , SEL_DLY1[M−1].

The second clock delay unit 530 includes a plurality of second delay cells LUD connected to each other in series. Among the constituent elements of the delay selection control unit 590, the second clock delay unit 530 controls the delay operation of the second delay cells LUD in response to N-M signals SEL_DLY2[0], . . . , SEL_DLY2[i−1], SEL_DLY2[i], SEL_DLY2[i+1], . . . , SEL_DLY2[N-M−1] outputted from the second delay controller 594.

Herein, among the constituent elements of the delay selection control unit 590, the delay line selection signal generator 596 performs an operation for determining the level of the delay unit selection signal HVDO according to the level of the detection signal VDET_LV in a period where no delay locked operation is performed in response to a delay locked reset signal DLL_RESET.

For example, in a period where the delay locked reset signal DLL_RESET is activated to a logic high level and the delay locked operation is not performed, it generates a delay unit selection signal HVDO having a logic high level in response to the logic high level of the detection signal VDET_LV or it generates a delay unit selection signal HVDO having a logic low level in response to the logic low level of the detection signal VDET_LV.

Conversely, among the constituent elements of the delay selection control unit 590, the delay line selection signal generator 596 does not change the level of the delay unit selection signal HVDO with no regard to the level of the detection signal VDET_LV in a period where the delay locked operation is performed in response to the delay locked reset signal DLL_RESET.

For example, in a period where the delay locked reset signal DLL_RESET is inactivated to a logic low level and the delay locked operation is performed, it does not matter whether the detection signal VDET_LV has a logic high level or a logic low level and the delay line selection signal generator 596 maintains the logic level determined in the previous duration where the delay locked operation is not performed as the logic level of the delay unit selection signal HVDO.

Among the constituent elements of the delay selection control unit 590, the first delay controller 592 does not change the logic levels of signals SEL_DLY1[0], . . . , SEL_DLY1[i−1], SEL_DLY1[i], SEL_DLY1[i+1], . . . , SEL_DLY1[M−1] outputted regardless of the levels of a pulse signal, the delay unit selection signal HVDO, and the output signal DELAY_LOCK_CTRL of the phase comparison unit 500 in a period where the delay locked operation is not performed in response to the delay locked reset signal DLL_RESET. In short, the reference clock REFCLK is not delayed in the first clock delay unit 520.

Conversely, the first delay controller 592 changes the logic levels of M signals SEL_DLY1[0], ..., SEL_DLY1[i−1], SEL_DLY1[i], SEL_DLY1[i+1], ..., SEL_DLY1[M−1] outputted at each cycle where a pulse signal is toggled in according to the output signal DELAY_LOCK_CTRL of the phase comparison unit 500 in a sequence corresponding to the delay unit selection signal HVDO at each cycle where a pulse signal is toggled in a period where the delay locked operation is performed in response to the delay locked reset signal DLL_RESET.

Similarly, among the constituent elements of the delay selection control unit 590, the second delay controller 594 does not change the logic levels of signals SEL_DLY2[0], ..., SEL_DLY2[i−1], SEL_DLY2[i], SEL_DLY2[i+1], ..., SEL_DLY2[N-M−1] outputted regardless of the levels of a pulse signal, a delay unit selection signal HVDO, and the output signal DELAY_LOCK_CTRL of the phase comparison unit 500 in a period where the delay locked operation is not performed in response to the delay locked reset signal DLL_RESET. In short, the reference clock REFCLK is not delayed in the second clock delay unit 530.

Conversely, the second delay controller 594 varies the logic levels of N-M signals SEL_DLY2[0], ..., SEL_DLY2[i−1], SEL_DLY2[i], SEL_DLY2[i+1], ..., SEL_DLY2[N-M−1] outputted at each cycle where the pulse signal is toggled according to the output signal DELAY_LOCK_CTRL of the phase comparison unit 500 in a sequence corresponding to the delay unit selection signal HVDO in a period where the delay locked operation is performed in response to the delay locked reset signal DLL_RESET.

For example, in a period where the delay locked reset signal DLL_RESET is inactivated to a logic low level and the delay locked operation is performed, the second delay controller 594 varies the logic levels of N-M signals SEL_DLY2[0], ..., SEL_DLY2[i−1], SEL_DLY2[i], SEL_DLY2[i+1], ..., SEL_DLY2[N-M−1] outputted from the second delay controller 594 following M signals SEL_DLY1[0], ..., SEL_DLY1[i−1], SEL_DLY1[i], SEL_DLY1[i+1], ..., SEL_DLY1[M−1] outputted from the first delay controller 592 at each cycle where the pulse signal is toggled to a logic high level according to the output signal DELAY_LOCK_CTRL of the phase comparison unit 500. When the delay unit selection signal HVDO is a logic low level, the second delay controller 594 varies the logic levels of N-M signals SEL_DLY2[0], ..., SEL_DLY2[i−1], SEL_DLY2[i], SEL_DLY2[i+1], ..., SEL_DLY2[N-M−1] outputted from the second delay controller 594 following M signals SEL_DLY1[0], ..., SEL_DLY1[i−1], SEL_DLY1[i], SEL_DLY1[i+1], ..., SEL_DLY1[M−1] outputted from the first delay controller 592 at each cycle where the pulse signal is toggled to a logic high level according to the output signal DELAY_LOCK_CTRL of the phase comparison unit 500 at each cycle where the pulse signal is toggled to a logic high level.

Herein, when the output signal DELAY_LOCK_CTRL of the phase comparison unit 500 is a logic high level, the second delay controller 594 varies the logic levels of the signals SEL_DLY1[0], ..., SEL_DLY1[i−1], SEL_DLY1[i], SEL_DLY1[i+1], ..., SEL_DLY1[M−1] outputted from the first delay controller 592 and the N-M signals SEL_DLY2[0], ..., SEL_DLY2[i−1], SEL_DLY2[i], SEL_DLY2[i+1], ..., SEL_DLY2[N-M−1] outputted from the second delay controller 594 so that the delay amounts of the first clock delay unit 520 and the second clock delay unit 530 are decreased and the reference clock REFCLK is delayed. Conversely, when the output signal DELAY_LOCK_CTRL of the phase comparison unit 500 is a logic low level, the second delay controller 594 varies the logic levels of the signals SEL_DLY1[0], ..., SEL_DLY1[i−1], SEL_DLY1[i], SEL_DLY1[i+1], ..., SEL_DLY1[M−1] outputted from the first delay controller 592 and the N-M signals SEL_DLY2[0], ..., SEL_DLY2[i−1], SEL_DLY2[i], SEL_DLY2[i+1], ..., SEL_DLY2[N-M−1] outputted from the second delay controller 594 so that the delay amounts of the first clock delay unit 520 and the second clock delay unit 530 are increased and the reference clock REFCLK is delayed.

Among the constituent elements of the delay selection control unit 590, the output selector 597 selects one of a clock SUD_CLK outputted from the first clock delay unit 520 and a clock LUD_CLK outputted from the second clock delay unit 530 and outputs a delay locked clock DLLCLK in response to the delay unit selection signal HVDO.

For example, the output selector 597 selects the clock SUD_CLK outputted from the first clock delay unit 520 and outputs the delay locked clock DLLCLK in response to the delay unit selection signal HVDO activated to a logic high level. Also, the output selector 597 selects the clock LUD_CLK outputted from the second clock delay unit 530 and outputs the delay locked clock DLLCLK in response to the delay unit selection signal HVDO inactivated to a logic low level.

Among the constituent elements of the delay selection control unit 590, the first transfer selector 598 transfers any one signal between the output clock LUD_CLK of the second clock delay unit 530 and a signal having a power source voltage VDD level to the first clock delay unit 520 in response to the delay unit selection signal HVDO. Herein, when the output clock LUD_CLK of the second clock delay unit 530 is transferred to the first clock delay unit 520, the first clock delay unit 520 takes over the delay amount used for delaying the reference clock REFCLK in the second clock delay unit 530 and performs an additional delay operation. On the other hand, when the signal having a power source voltage VDD level is transferred to the first clock delay unit 520, the first clock delay unit 520 independently performs an operation of delaying the reference clock REFCLK without taking over any delay amount.

Among the constituent elements of the delay selection control unit 590, the second transfer selector 525 transfers any one signal between the output clock SUD_CLK of the first clock delay unit 520 and the signal having a power source voltage VDD level to the second clock delay unit 530 in response to the delay unit selection signal HVDO. Herein, when the output clock SUD_CLK of the first clock delay unit 520 is transferred to the second clock delay unit 530, the second clock delay unit 530 takes over the delay amount used for delaying the reference clock REFCLK in the first clock delay unit 520 and performs an additional delay operation. On the other hand, when the signal having a power source voltage VDD level is transferred to the second clock delay unit 530, the second clock delay unit 530 independently performs an operation of delaying the reference clock REFCLK without taking over any delay amount.

The first transfer selector 523 and the second transfer selector 525 should perform an operation in opposite to each other in response to the delay unit selection signal HVDO. For example, when the first transfer selector 523 transfers the output clock LUD_CLK of the second clock delay unit 530 to the first clock delay unit 520 in response to the delay unit selection signal HVDO activated to a logic high level, and transfers the signal having a power source voltage VDD level to the first clock delay unit 520 in response to the delay unit selection signal HVDO inactivated to a logic low level, the second transfer selector 525, conversely, transfers the signal having a power source voltage VDD level to the second clock delay unit 530 in response to the delay unit selection signal HVDO activated to a logic high level, and transfers the output clock SUD_CLK of the first clock delay unit 520 to the second clock delay unit 530 in response to the delay unit selection signal HVDO inactivated to a logic low level.

Among the constituent elements of the delay selection control unit 590, the first clock delay unit 520 includes a plurality of first delay cells SUD connected to each other in series inside and the first clock delay unit 520 delays an input clock by a delay amount of a first delay cell unit corresponding to M signals SEL_DLY1[0], . . . , SEL_DLY1[i−1], SEL_DLY1[i], SEL_DLY1[i+1], . . . , SEL_DLY1[M−1] outputted from the first delay controller 592 and outputs the delayed clock.

Herein, the clock inputted to the first clock delay unit 520 may be the reference clock REFCLK or the output clock LUD_CLK of the second clock delay unit 530. When a signal having a power source voltage VDD level is supplied from the first transfer selector 523, the input clock becomes the reference clock REFCLK.

In other words, when the first clock delay unit 520 is selected as an initial delay unit, the input clock becomes the reference clock REFCLK. However, when the first clock delay unit 520 is selected as a connected delay unit, the input clock becomes the output clock LUD_CLK of the second clock delay unit 530.

Among the constituent elements of the delay selection control unit 590, the second clock delay unit 530 includes a plurality of second delay cells LUD connected to each other in series inside and the second clock delay unit 530 delays an input clock by a delay amount of a second delay cell unit corresponding to N−M signals SEL_DLY2[0], . . . , SEL_DLY2[i−1], SEL_DLY2[i], SEL_DLY2[i+1], . . . , SEL_DLY2[N−M−1] outputted from the second delay controller 594 and outputs the delayed clock.

Herein, the clock inputted to the second clock delay unit 530 may be the reference clock REFCLK or the output clock SUD_CLK of the first clock delay unit 520. When a signal having a power source voltage VDD level is supplied from the second transfer selector 525, the input clock becomes the reference clock REFCLK.

In other words, when the second clock delay unit 530 is selected as an initial delay unit, the input clock becomes the reference clock REFCLK. However, when the second clock delay unit 530 is selected as a connected delay unit, the input clock becomes the output clock SUD_CLK of the first clock delay unit 520.

According to the embodiments of the present invention described above, it is possible to stably perform a delay locked operation by performing a delay locked operation which includes detecting a variation in the level of an external power source voltage VDD, selecting one or more delay cells among a plurality of delay cells having a different delay amount based on a detection result, sequentially using the selected delay cells to delay the reference clock REFCLK and output a delay locked clock DLLCLK, regardless of the level fluctuation in the external power source voltage VDD.

The delay locked loop circuit of the present invention described above can stably perform a delay locked operation regardless of a variation in the level of external power source voltage VDD by detecting a change in the level of the external power source voltage to thereby produce a detection result, selecting one or more delay cells among a plurality of delay cells with different delay amounts from each other based on the detection result, and performing the delay locked operation where the selected delay units are used sequentially to delay a reference clock and thus output the delayed reference clock as a delay locked clock.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors appearing in the above-described embodiments may be implemented differently according to the polarity of an input signal.

What is claimed is:

1. A delay locked loop circuit, comprising:
a voltage level detection unit configured to detect a level of an external power source voltage;
a phase comparison unit configured to compare a phase of a reference clock with a phase of a feedback clock;
a clock delay unit configured to designate one of a first delay cell unit and a second delay cell unit as an initial delay cell unit and the other as a connected delay cell unit based on an output signal of the voltage level detection unit, delay the reference clock by the initial delay cell unit until a delay amount of the reference clock reaches a predetermined delay amount, delay the reference clock by the connected delay cell unit after the delay amount of the reference clock reaches the predetermined delay amount in response to an output signal of the phase comparison unit, and output a delay locked clock; and
a delay duplication modeling unit configured to change the delay locked clock to reflect an actual delay condition of the reference clock and output the feedback clock.

2. The delay locked loop circuit of claim 1, wherein the voltage level detection unit is configured to output an activated detection signal when the level of the external power source voltage is higher than a reference voltage having a predetermined voltage level and output an inactivated detection signal when the level of the external power source voltage is lower than the reference voltage.

3. The delay locked loop circuit of claim 2, wherein the clock delay unit is configured to designate the first delay cell unit as the initial delay cell unit and the second delay cell unit as the connected delay cell unit in response to the inactivated detection signal in a period where a delay locked reset signal is activated and a delay locked operation is inactivated, and
the clock delay unit is configured to designate the second delay cell unit as the initial delay cell unit and the first delay cell unit as the connected delay cell unit in response to the activated detection signal in a period where a delay locked reset signal is activated and a delay locked operation is inactivated.

4. The delay locked loop circuit of claim 3, wherein in a period where the delay locked reset signal is inactivated and the delay locked operation is activated, the clock delay unit is configured to not change the delay cell units designated as the initial delay cell unit and the connected delay cell unit, respectively, in the period where the delay locked operation is inactivated, regardless of a logic level of the detection signal.

5. The delay locked loop circuit of claim 1, wherein the phase comparison unit is configured to output an inactivated delay locked control signal when a phase difference between the reference clock and the feedback clock goes beyond a predetermined range, and output an activated delay locked control signal when the phase difference between the reference clock and the feedback clock does not go beyond the predetermined range.

6. The delay locked loop circuit of claim 5, wherein the clock delay unit is configured to delay the reference clock in response to the inactivated delay locked control signal and to not delay the reference clock in response to the activated delay locked control signal.

7. The delay locked loop circuit of claim 6, wherein the clock delay unit is configured to:
   delay the reference clock by the initial delay cell unit at each predetermined cycle in response to the inactivated delay locked control signal,
   delay the reference clock by the connected delay cell unit at the predetermined cycle in response to the inactivated delay locked control signal after the reference clock is delayed by as much as the predetermined delay amount, and
   not delay the reference clock in response to the activated delay locked control signal.

8. The delay locked loop circuit of claim 1, wherein the phase comparison unit is configured to output an inactivated normal delay locked control signal when a phase difference between the reference clock and the feedback clock goes beyond a first predetermined range, and output an activated normal delay locked control signal when the phase difference between the reference clock and the feedback clock does not go beyond the first predetermined range, and
   the phase comparison unit is configured to output an inactivated fine delay locked control signal when the phase difference between the reference clock and the feedback clock goes beyond a second predetermined range, and output an activated fine delay locked control signal when the phase difference between the reference clock and the feedback clock does not go beyond the second predetermined range.

9. The delay locked loop circuit of claim 8, wherein the clock delay unit is configured to:
   delay the reference clock by the initial delay cell unit or the connected delay cell unit at each predetermined cycle in response to the inactivated normal delay locked control signal,
   delay the reference clock by as much as a delay unit obtained by dividing a delay amount of a delay cell corresponding to the initial delay cell or the connected delay cell by a predetermined number at each predetermined cycle in response to the inactivated fine delay locked control signal and the activated normal delay locked control signal, and
   not delay the reference clock in response to the activated fine delay locked control signal.

10. The delay locked loop circuit of claim 9, wherein the clock delay unit is configured to:
    delay the reference clock by the initial delay cell unit at each predetermined cycle in response to the inactivated normal delay locked control signal,
    delay the reference clock by a delay unit obtained by dividing a delay amount of the initial delay cell by a predetermined number at each predetermined cycle in response to the activated normal delay locked control signal and the inactivated fine delay locked control signal before the reference clock is delayed by as much as the predetermined delay amount, and
    not delay the reference clock any more in response to the activated fine delay locked control signal before the reference clock is delayed by as much as the predetermined delay amount.

11. The delay locked loop circuit of claim 10, wherein the clock delay unit is configured to:
    delay the reference clock by the initial delay cell unit at the predetermined cycle in response to the inactivated normal delay locked control signal,
    delay the reference clock by the connected delay cell unit at the predetermined cycle in response to the inactivated normal delay locked control signal after the reference clock is delayed by as much as the predetermined delay amount,
    delay the reference clock by as much as a delay unit obtained by dividing a delay amount of the connected delay cell by a predetermined number at the predetermined cycle in response to the activated normal delay locked control signal and the inactivated fine delay locked control signal after the reference clock is delayed by as much as the predetermined delay amount, and
    not delay the reference clock any more in response to the activated fine delay locked control signal after the reference clock is delayed by as much as the predetermined delay amount.

12. A delay locked loop circuit, comprising:
    a voltage level detection unit configured to detect a level of an external power source voltage;
    a phase comparison unit configured to compare a phase of a reference clock with a phase of a feedback clock;
    a first clock delay unit configured to delay the reference clock by a first delay cell unit in response to an output signal of the phase comparison unit;
    a second clock delay unit configured to delay the reference clock by a second delay cell unit in response to an output signal of the phase comparison unit;
    a delay selection control unit configured to perform a control to designate one of a first clock delay unit and a second clock delay unit as an initial delay unit and the other as a connected delay unit based on an output signal of the voltage level detection unit, and delay the reference clock by operating the initial delay unit until a delay amount of the reference clock reaches a predetermined delay amount and operating the connected delay unit after the delay amount of the reference clock reaches the predetermined delay amount; and
    a delay duplication modeling unit configured to change the delay locked clock outputted from the first and second clock delay units to reflect an actual delay condition of the reference clock and output the feedback clock.

13. The delay locked loop circuit of claim 12, wherein the voltage level detection unit is configured to output an activated detection signal when the level of the external power source voltage is higher than a reference voltage having a predetermined voltage level and output an inactivated detection signal when the level of the external power source voltage is lower than the reference voltage.

14. The delay locked loop circuit of claim 13, wherein the delay selection control unit is configured to designate the first clock delay unit as the initial delay unit and the second clock delay unit as the connected delay unit in response to the inactivated detection signal in a period where a delay locked reset signal is activated and a delay locked operation is inactivated, and
    the delay selection control unit is configured to designate the second clock delay unit as the initial delay unit and the first clock delay unit as the connected delay unit in response to the activated detection signal in a period where a delay locked reset signal is activated and a delay locked operation is inactivated.

15. The delay locked loop circuit of claim 14, wherein in a period where the delay locked reset signal is inactivated and the delay locked operation is activated, the delay selection control unit is configured to not change the clock delay units designated as the initial delay unit and the connected delay unit, respectively, in the duration where the delay locked operation is inactivated, regardless of a logic level of the detection signal.

16. The delay locked loop circuit of claim 12, wherein the phase comparison unit is configured to output an inactivated delay locked control signal when a phase difference between the reference clock and the feedback clock goes beyond a predetermined range, and output an activated delay locked control signal when the phase difference between the reference clock and the feedback clock does not go beyond the predetermined range.

17. The delay locked loop circuit of claim 16, wherein each of the first and second clock delay units is configured to delay the reference clock in response to the inactivated delay locked control signal and not delay the reference clock in response to the activated delay locked control signal.

18. The delay locked loop circuit of claim 17, wherein the delay selection control unit is configured to:
    perform a control to delay the reference clock by a delay cell unit corresponding to the initial delay unit at a predetermined cycle by operating the initial delay unit in response to the inactivated delay locked control signal,
    perform a control to delay the reference clock by a delay cell unit of a delay cell corresponding to the connected delay unit at the predetermined cycle by terminating an operation of the initial delay unit and operating the connected delay unit in response to the inactivated delay locked control signal after the reference clock is delayed by the predetermined delay amount, and
    perform a control not to delay the reference clock by terminating an operation of the initial delay unit or the connected delay unit in response to the activated delay locked control signal.

19. The delay locked loop circuit of claim 12, wherein the phase comparison unit is configured to output an inactivated normal delay locked control signal when a phase difference between the reference clock and the feedback clock goes beyond a first predetermined range, and output an activated normal delay locked control signal when the phase difference between the reference clock and the feedback clock does not go beyond the first predetermined range, and
    the phase comparison unit is configured to output an inactivated fine delay locked control signal when the phase difference between the reference clock and the feedback clock goes beyond a second predetermined range, and output an activated fine delay locked control signal when the phase difference between the reference clock and the feedback clock does not go beyond the second predetermined range.

20. The delay locked loop circuit of claim 19, wherein the delay selection control unit is configured to:
    perform a control to delay the reference clock by a delay cell unit of a delay cell corresponding to the initial delay cell or the connected delay cell at each predetermined cycle by operating the initial delay unit or the connected delay unit in response to the inactivated normal delay locked control signal,
    perform a control to delay the reference clock by as much as a delay unit obtained by dividing a delay amount of a delay cell corresponding to the initial delay unit or the connected delay unit by a predetermined number at each predetermined cycle by operating the initial delay unit or the connected delay unit in response to the inactivated fine delay locked control signal and the activated normal delay locked control signal, and
    perform a control not to delay the reference clock by terminating an operation of the initial delay unit or the connected delay unit in response to the activated fine delay locked control signal.

21. The delay locked loop circuit of claim 20, wherein the delay selection control unit is configured to:
    perform a control to delay the reference clock by a delay cell unit of a delay cell corresponding to the initial delay unit at each predetermined cycle by operating the initial delay unit in response to the inactivated normal delay locked control signal,
    perform a control to delay the reference clock by as much as a delay unit obtained by dividing a delay amount of a delay cell corresponding to the initial delay unit by a predetermined number at each predetermined cycle by operating the initial delay unit in response to the activated normal delay locked control signal and the inactivated fine delay locked control signal before the reference clock is delayed by as much as the predetermined delay amount, and
    perform a control not to delay the reference clock any more by terminating an operation of the initial delay unit in response to the activated fine delay locked control signal before the reference clock is delayed by as much as the predetermined delay amount.

22. The delay locked loop circuit of claim 21, wherein the delay selection control unit is configured to:
    perform a control to delay the reference clock by a delay cell unit of a delay cell corresponding to the initial delay unit at the predetermined cycle by operating the initial delay unit in response to the inactivated normal delay locked control signal,
    perform a control to delay the reference clock by a delay cell unit of a delay cell corresponding to the connected delay unit at the predetermined cycle by terminating an operation of the initial delay unit and operating the connected delay unit in response to the inactivated normal delay locked control signal after the reference clock is delayed by as much as the predetermined delay amount,
    perform a control to delay the reference clock by a delay unit obtained by dividing a delay amount of a delay cell corresponding to the connected delay unit by a predetermined number at the predetermined cycle by operating the connected delay unit in response to the activated normal delay locked control signal and the inactivated fine delay locked control signal after the reference clock is delayed by as much as the predetermined delay amount, and
    perform a control not to delay the reference clock any more by terminating an operation of the connected delay unit in response to the activated fine delay locked control signal after the reference clock is delayed by as much as the predetermined delay amount.

* * * * *